US009106216B1

(12) United States Patent
Chhodavdia et al.

(10) Patent No.: US 9,106,216 B1
(45) Date of Patent: Aug. 11, 2015

(54) PROGRAMMABLE PULSE GENERATION

(71) Applicant: Microsoft Corporation, Redmond, WA (US)

(72) Inventors: Avdhesh Chhodavdia, Fremont, CA (US); Michael S. Fenton, Palo Alto, CA (US); Sheethal Somesh Nayak, San Francisco, CA (US)

(73) Assignee: Microsoft Technology Licensing LLC, Redmond, WA (US)

( * ) Notice: Subject to any disclaimer, the term of this patent is extended or adjusted under 35 U.S.C. 154(b) by 0 days.

(21) Appl. No.: 14/448,593

(22) Filed: Jul. 31, 2014

(51) Int. Cl.
*H03L 7/00* (2006.01)
*H03K 3/66* (2006.01)
*H03K 3/012* (2006.01)

(52) U.S. Cl.
CPC .................. *H03K 3/66* (2013.01); *H03K 3/012* (2013.01); *H03L 7/00* (2013.01)

(58) Field of Classification Search
USPC .......................................... 327/100
See application file for complete search history.

(56) References Cited

U.S. PATENT DOCUMENTS

| 4,975,931 | A | * | 12/1990 | Cosand ........................... 377/52 |
| 6,191,821 | B1 | | 2/2001 | Kupnicki |
| 8,307,235 | B2 | | 11/2012 | Patel et al. |
| 8,392,740 | B2 | | 3/2013 | Dewhirst et al. |
| 8,571,005 | B1 | | 10/2013 | Vleugels et al. |

OTHER PUBLICATIONS

"Synchronization Explained", In White Paper, Aug. 29, 2012, 11 pages.

* cited by examiner

*Primary Examiner* — Daniel Puentes
(74) *Attorney, Agent, or Firm* — Ladislav Kusnyer; Judy Yee; Micky Minhas

(57) ABSTRACT

An electronic device includes a configurable pulse generator configured to generate a programmable master pulse train. One or more functional circuits of the electronic device includes a programming interface to receive one or more a programmable slave pulse parameters for the one or more functional circuits. The programmable slave pulse parameters are dependent upon the programmable master pulse train. A slave pulse generator generates a slave pulse for one of the functional circuits based on the one or more programmable slave pulse parameters corresponding to the functional circuits relative to the programmable master pulse train.

19 Claims, 5 Drawing Sheets

PROGRAMMABLE PULSE GENERATION

BRIEF DESCRIPTIONS OF THE DRAWINGS

DETAILED DESCRIPTIONS

Multiple electronic components in electronic devices may be synchronized or orchestrated to perform a single unified function. For example, a video camera may use a pixel capture circuit to read pixel values from a sensor and to pass the pixel values to image processing circuitry for encoding/compression by an encoding circuit to comply with a particular video encoding format. The various component circuits may coordinate their individual state machines with those of other component circuits using a complex synchronization protocol followed by each component circuit. However, unexpected processing speed changes in one or more of the component circuits can cause problems with this approach. Moreover, desirable operational changes can require new circuitry or circuitry changes because reconfiguration of the complex synchronization protocol is difficult or problematic after the circuitry has been manufactured and released.

In an implementation of the described technology, multiple component circuits are coordinated according to configurable slave synchronization events with reference to a configurable, centralized, master synchronization pulse train. The individual component circuits are associated with individual slave pulse (synchronization) parameters, such as start, start offset, stop, and stop offset, relative to the programmable master synchronization pulse train. The master synchronization pulse train and the individual synchronization parameters of each component circuit can be modified at any time after manufacturing and release to adapt to new operational requirements.

Figure 1:
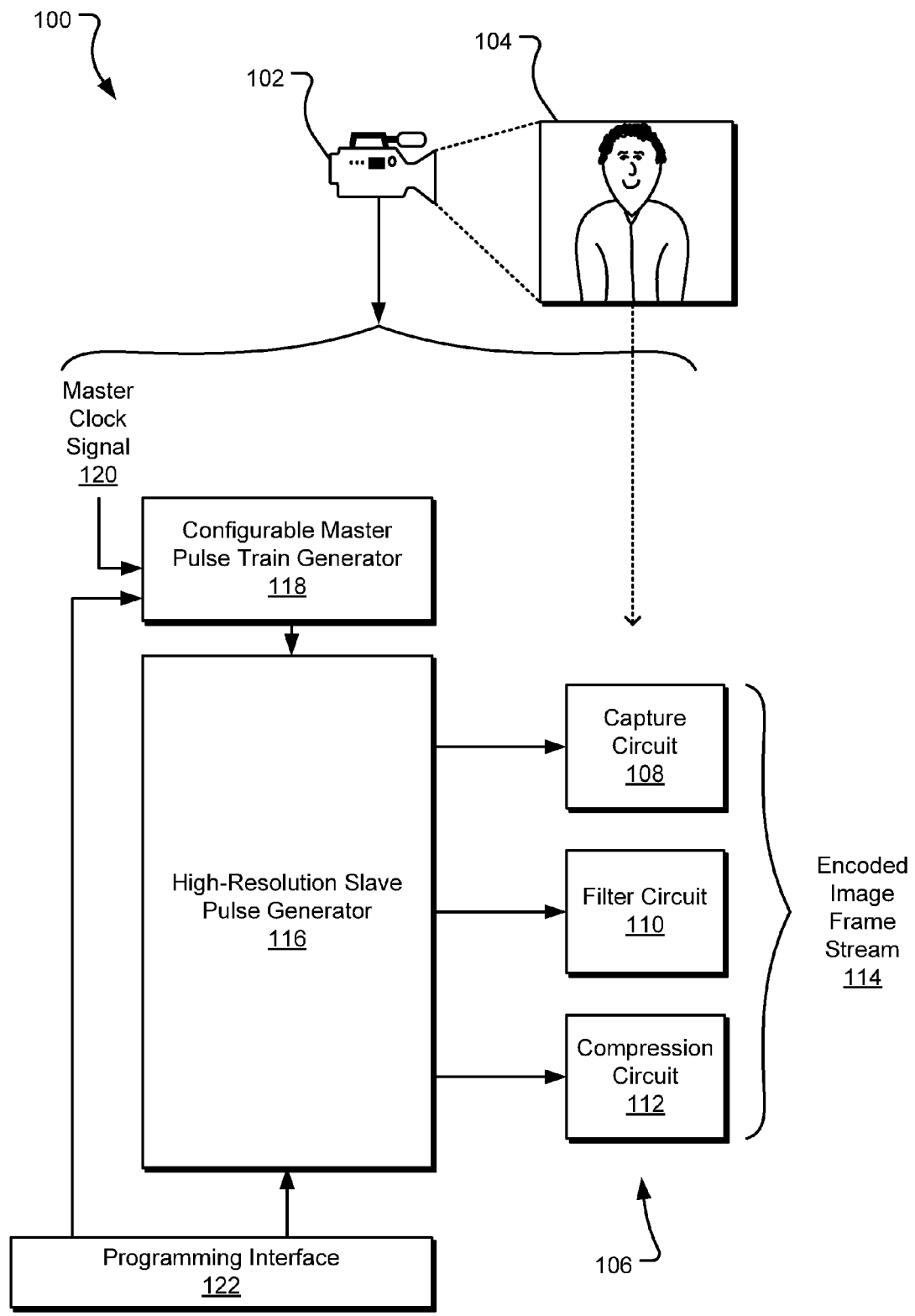
FIG. 1 illustrates an example configurable synchronization system providing configurable synchronization of multiple slave pulses.

FIG. 1 illustrates an example configurable synchronization system 100 providing configurable synchronization of multiple slave pulses. The example system configurable synchronization 100 is shown as incorporated into a video camera 102, although the example configurable synchronization system 100 may be employed in other devices utilizing configurable synchronization of multiple slave pulses, including set-top boxes, tablet computers, gaming consoles, control systems, laptop computers, desktop computers, mobile electronic devices, etc.

In the example configurable synchronization system 100, as embodied in the video camera 102, a sensor of the video camera 102 captures one or more image frames 104, passing the one or more image frames 104 to multiple functional circuits 106, whether in parallel, sequentially or independently, for image processing. In one example, the functional circuits 106 may include a capture circuit 108, a filter circuit 110, and a compression circuit 112, although different functional circuits may be employed in other implementations.

Further, individual functional circuits 106 may have multiple operational modes associated with different synchronization arrangements. For example, the compression circuit 112 may include a first operational mode for compressing of pixel values within a row of each image frame, a second operational mode for compressing pixel values in multiple rows of each image frame, and a third operational mode for compressing pixel values among multiple image frames (e.g., temporal compression). The configurable synchronization system 100 can coordinate operation of multiple functional circuits 106 and/or multiple modes of multiple functional circuits 106. Based on operation of the multiple functional circuits 106, the multiple functional circuits 106 generate an encoded image frame stream 114, which the system 100 can use for presentation to a user (e.g., via a user interface or video display), interaction with a game console, transmission to a tangible storage system or communications channel (e.g., for video conferencing), etc.

Each of the functional circuits 106, as well as operational modes of each functional circuit 106, can operate in response to slave pulses generated by a (programmable) high-resolution slave pulse generator 116. The high-resolution slave pulse generator 116 generates the slave pulses based on a programmable master pulse train received from a configurable (programmable) master pulse train generator 118, which is derived from a master clock signal 120. The high-resolution slave pulse generator 116 represents an embodiment of a means for generating a slave pulse as wells as means for starting and stopping a slave pulse. The high-resolution slave pulse generator 116 may also represent an embodiment of a means for setting a programmable start pulse parameter. The master clock signal 120 can be supplied or derived from a system clock within the video camera 102. In contrast to the master clock signal 120, the master pulse train supplied by the configurable master pulse train generator 118 is programmable via a programming interface 122 (e.g., means for setting a programmable start pulse parameter). For example, the configurable master pulse train generator 118 may be programmed to supply a master pulse train having groups of four master pulses, each master pulse starting four master clock periods from each other, each group being separated by six master clock periods (see, e.g., FIG. 2). Alternatively, because the configurable master pulse train generator 118 is programmable, the master pulse train can be re-configured (e.g., after hardware design or release) via the programming interface 122 within a large range of variations. For example, a reconfigured master pulse train can consist of groups of three master pulses, each master pulse starting three master clock periods from each other, each group being separated by ten master clock periods. Programming for the start of each group is with reference to the start/end of the previous group and the number of master pulses in the group (and optionally, an offset in terms of a number of master clock periods). Furthermore, in some implementations, a master pulse can have any shape.

Further, the configurable master pulse train generator 118 can be programmed to support multiple modes, such as multiple groupings of master pulse trains (e.g., one master pulse train consisting of two or more modes of grouped master pulses, a first mode having groups of two master pulses spaced by forty master clock periods, each master pulse spaced by three master clock periods, a second mode having groups of two master pulses spaced by five master clock periods, each master pulse being spaced by three master clock periods, etc.

In an implementation of the described technology, the high-resolution slave pulse generator 116 can be programmed for each functional circuit 106 and each mode thereof. The programmed slave pulses for each functional circuitry 106 and each mode thereof can be stored in dedicated registers or in persistent or volatile memory or datastores within or accessible by the high-resolution slave pulse generator 116 and programmable via the programming interface 122. The programming interface 122 can provide, whether by external or internal means, one or more slave pulse parameters, including without limitation, a start pulse, a start pulse offset, a stop pulse, and a stop pulse offset, relative to individual pulses of the configurable master pulse train, to provide the start timing and shape of the slave pulse provided to individual functional circuits 106. In this manner, the slave pulses supplied to the functional circuits 106 can be reconfigured after hardware design and release, as product design parameters evolve (e.g., new software that is executable by the system 100 and/or new hardware components and/or peripherals calls for changes in synchronization of the functional circuits and operational modes).

Figure 2:
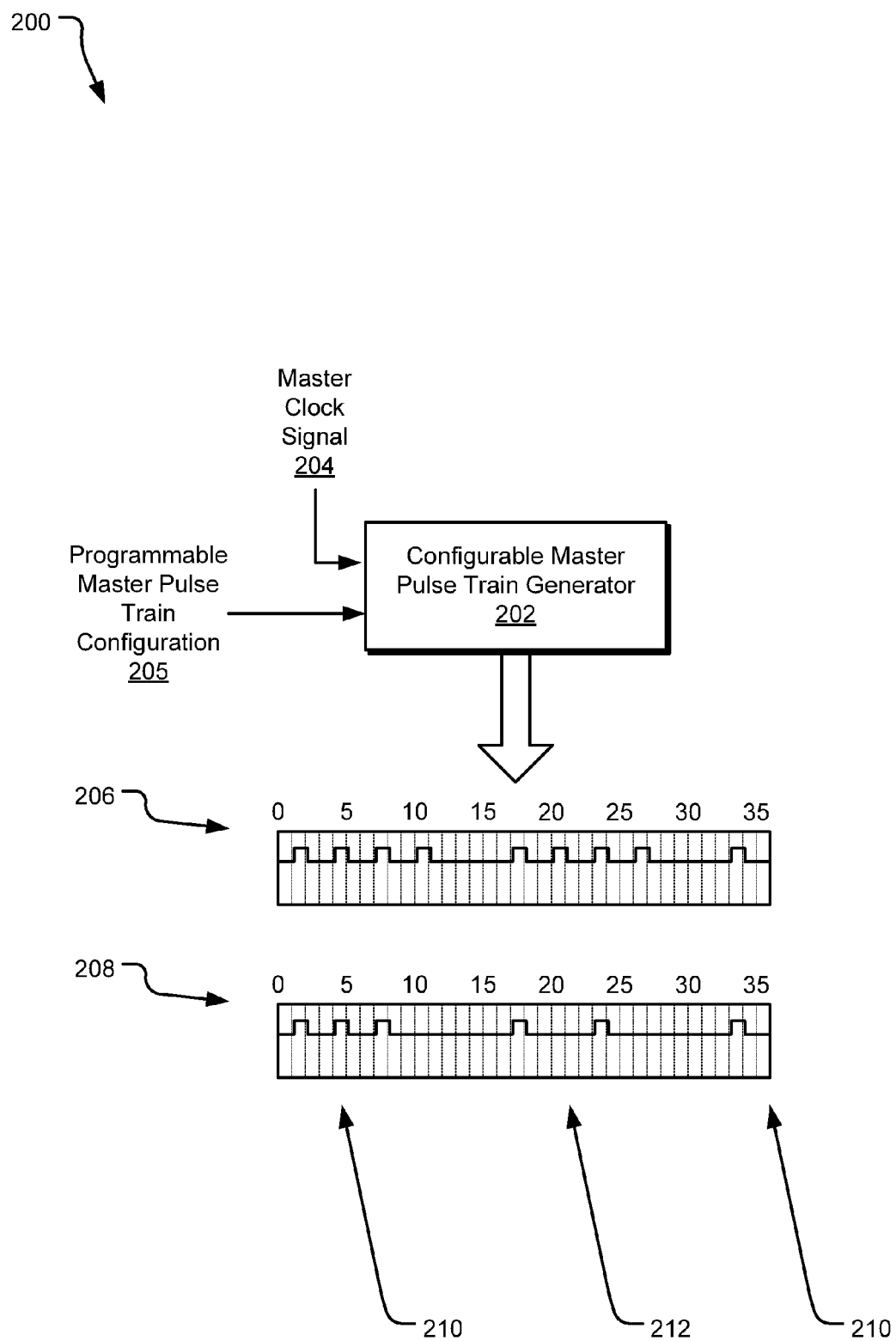
FIG. 2 illustrates example configurable master pulse train generator circuitry.

FIG. 2 illustrates example configurable master pulse train generator circuitry 200. A configurable master pulse train generator 202 is programmable and receives a master clock signal 204, such as from a system clock of a video camera, gaming console, set-top box, etc. The configurable master pulse train generator 202 also receives or has access to a programmable master pulse train configuration 205 providing master pulse train parameters upon which the configurable master pulse train generator 202 bases its generation of a master pulse train having one or more modes. For example, an example pulse train 206 generated by the configurable pulse train generator 202 includes a single-mode master pulse train having groups of four master pulses, each master pulse starting three master clock periods from each other, each group being separated by six master clock periods.

In a second example, an example pulse train 208 generated by the configurable pulse train generator 202 includes a dual-mode master pulse train, wherein a first mode 210 has groups of three master pulses, each master pulse starting two master clock periods from each other, each group being separated by twenty-five master clock periods, and a second mode 212 has groups of two master pulses, each master pulse starting five master clock periods from each other, each group being separated by a number of master clock periods (not specified in FIG. 2). Example group separations in the second mode of the dual-mode master pulse train 208 can include twenty-six master clock periods or some other number of master clock periods (e.g., a multiple of twenty-six master clock periods or any other programmable group separation). Other master pulse trains may be programmed for the configurable master pulse train generator 202, and such master pulse trains may have one or more programmable modes.

Figure 3:
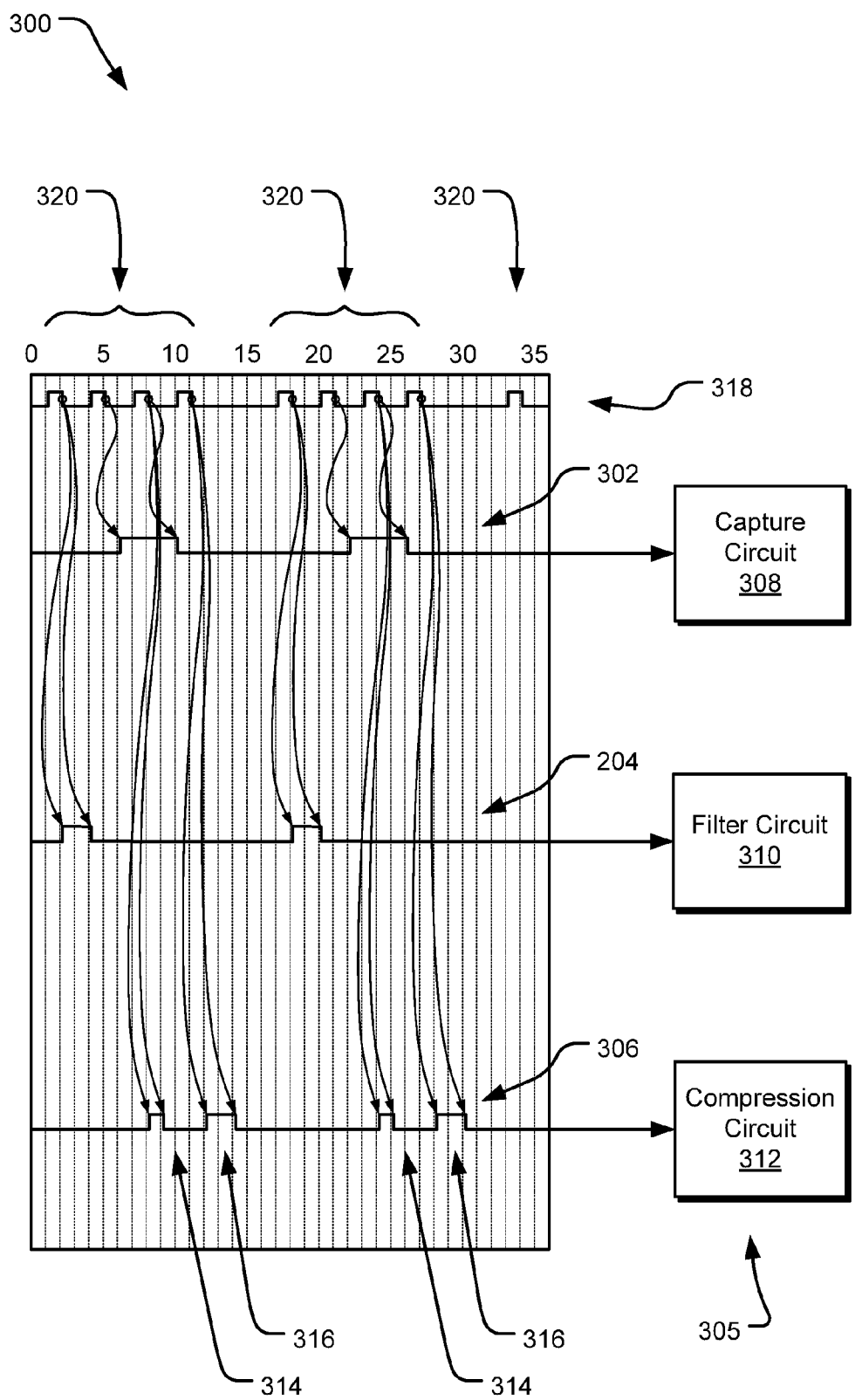
FIG. 3 illustrates example configurable synchronization of multiple slave pulses.

FIG. 3 illustrates example configurable synchronization 300 of multiple slave pulses 302, 304, and 306 for driving one or more modes of functional circuits 305. The slave pulse 302 drives a capture circuit 308, which captures pixel values of images received by a video camera sensor, for example. The slave pulse 304 drives a filter circuit 310, which filters the captured pixel values of the images. The slave pulse 306 drives a compression circuit 312 and includes two modes, represented by slave pulses 314 and 316.

Each slave pulse 302, 304, and 306 is configurable via a programming interface, whether internally or externally, which provides parameters for defining the individual slave pulses relative to a programmable master pulse train 318. Example programmable slave pulse parameters can include a start parameter, a start offset parameter, a stop parameter, and a stop offset parameter. In one implementation, all four programmable slave pulse parameters are used to define the slave pulse for each operational mode of each functional circuit 305, although one or more of the programmable slave pulse parameters may be used in other implementations.

The capture circuit 308 is driven by a slave pulse 302 defined by the following programmable slave pulse parameters relative to the master pulse train 318 (pulse and group numbering is zero-based):
  Start: Master slave pulse 1 of master group 0
  Start Offset: 1 master clock period
  Stop: Master slave pulse 2 of master group 0
  Stop Offset: 2 master clock periods The filter circuit 310 is driven by a slave pulse 304 defined by the following programmable slave pulse parameters relative to the master pulse train 318 (pulse and group numbering is zero-based):
  Start: Master slave pulse 0 of master group 0
  Start Offset: 0 master clock periods
  Stop: Master slave pulse 0 of master group 0
  Stop Offset: 2 master clock periods The compression circuit 312 is driven by a slave pulse 306 having two modes (as illustrated by pulse modes 314 and 316) and defined by the following programmable slave pulse parameters relative to the master pulse train 318 (pulse, group, and mode numbering is zero-based):
  Mode 0:
    Start: Master slave pulse 2 of master group 0
    Start Offset: 0 master clock periods
    Stop: Master slave pulse 2 of master group 0
    Stop Offset: 1 master clock period
  and
  Mode 1:
    Start: Master slave pulse 3 of master group 0
    Start Offset: 1 master clock period
    Stop: Master slave pulse 3 of master group 0
    Stop Offset: 3 master clock periods The example shown in FIG. 3 employs a single mode master pulse train (e.g., one master pulse train grouping, as shown by uniform groups 320). In an alternative implementation, a multi-mode master pulse train can be employed. Accordingly, the slave pulse train parameter "master group" can be programmed differently for different slave pulse trains or modes to represent the dependence of a particular slave pulse train or mode on a different master pulse train group.

Figure 4:
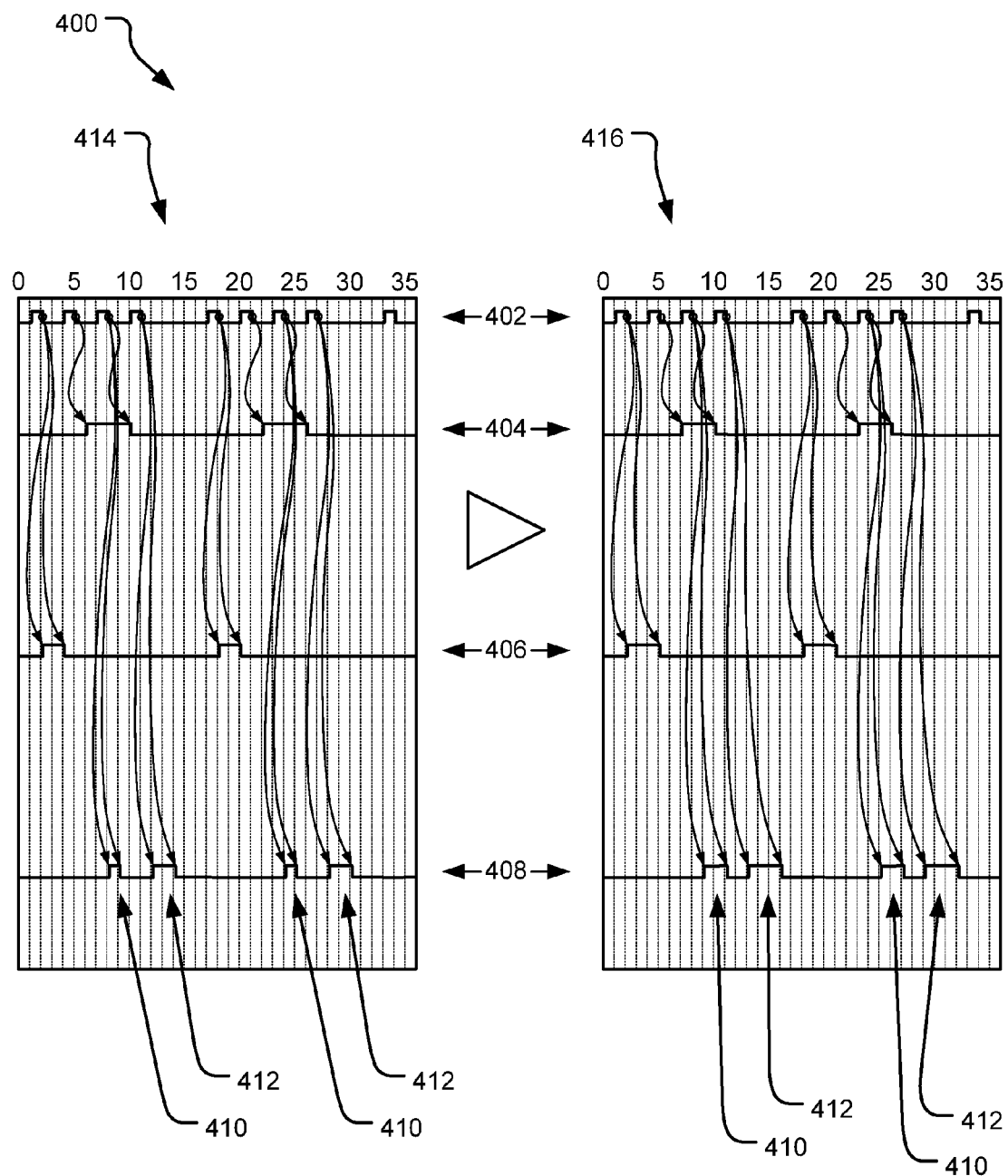
FIG. 4 illustrates example reconfiguration of synchronization of multiple slave pulses.

FIG. 4 illustrates example reconfiguration 400 of synchronization of multiple slave pulses 404, 406, and 408. Each slave pulse is programmably re-configurable relative to a configurable master pulse train 402. In configuration 414, the slave pulses 404, 406, and 408 are programmed in accordance with the following pulse parameters:

The slave pulse 404 is defined by the following programmable slave pulse parameters relative to the master pulse train 402 (pulse and group numbering is zero-based):
  Start: Master slave pulse 1 of master group 0
  Start Offset: 1 master clock period
  Stop: Master slave pulse 2 of master group 0
  Stop Offset: 2 master clock periods The slave pulse 406 is defined by the following programmable slave pulse parameters relative to the master pulse train 402 (pulse and group numbering is zero-based):
  Start: Master slave pulse 0 of master group 0
  Start Offset: 0 master clock periods
  Stop: Master slave pulse 0 of master group 0
  Stop Offset: 2 master clock periods The slave pulse 408 has two modes (as defined by pulse modes 410 and 412) and is defined by the following programmable slave pulse parameters relative to the master pulse train 402 (pulse, group, and mode numbering is zero-based):
  Mode 0:

Start: Master slave pulse 2 of master group 0
Start Offset: 0 master clock periods
Stop: Master slave pulse 2 of master group 0
Stop Offset: 1 master clock period
and
  Mode 1:
    Start: Master slave pulse 3 of master group 0
    Start Offset: 1 master clock period
    Stop: Master slave pulse 3 of master group 0
    Stop Offset: 3 master clock periods The slave pulses 404, 406, and 408 can be reconfigured via a programming interface (whether externally or internally/automatically) to be defined by a different set of pulse parameters. In configuration 416, the slave pulses 404, 406, and 408 are re-programmed as follows.

The reconfigured slave pulse 404 is defined by the following programmable slave pulse parameters relative to the master pulse train 402 (pulse and group numbering is zero-based):
  Start: Master slave pulse 1 of master group 0
  Start Offset: 2 master clock periods (the start offset is reconfigured)
  Stop: Master slave pulse 2 of master group 0
  Stop Offset: 2 master clock periods The reconfigured slave pulse 406 is defined by the following programmable slave pulse parameters relative to the master pulse train 402 (pulse and group numbering is zero-based):
  Start: Master slave pulse 0 of master group 0
  Start Offset: 0 master clock periods
  Stop: Master slave pulse 0 of master group 0
  Stop Offset: 3 master clock periods (the stop offset is reconfigured)

The reconfigured slave pulse 408 has two modes (as defined by pulse modes 410 and 412) and is defined by the following programmable slave pulse parameters relative to the master pulse train 402 (pulse, group, and mode numbering is zero-based):
  Mode 0:
    Start: Master slave pulse 2 of master group 0
    Start Offset: 1 master clock period (the start offset is reconfigured)
    Stop: Master slave pulse 2 of master group 0
    Stop Offset: 3 master clock period (the stop offset is reconfigured)
and
  Mode 1:
    Start: Master slave pulse 3 of master group 0
    Start Offset: 2 master clock periods (the start offset is reconfigured)
    Stop: Master slave pulse 3 of master group 0
    Stop Offset: 5 master clock periods (the stop offset is reconfigured)

Although not shown in FIG. 4, reconfiguration can also be accomplished by changing the start and/or stop parameters. Furthermore, reconfiguration can also be accomplished by changing (e.g., switching, adding, or subtracting the master pulse groups upon which a slave pulse depends).

Figure 5:
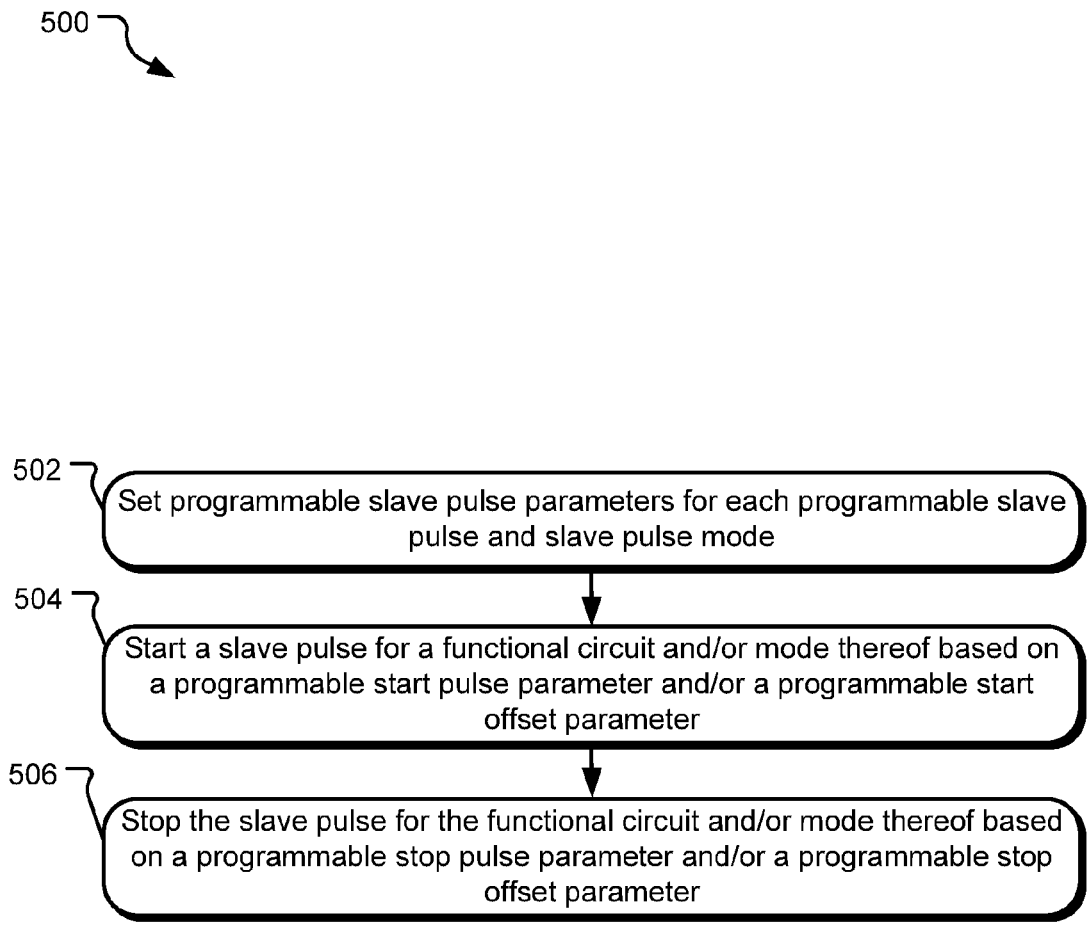
FIG. 5 illustrates example operations for configurable synchronization of multiple slave pulses for an electronic device.

FIG. 5 illustrates example operations 500 for configurable synchronization of multiple slave pulses for an electronic device. A programming operation 502 sets programmable slave pulse parameters for each programmable slave pulse and slave pulse mode. Example programmable slave pulse parameters can include without limitation a programmable start pulse parameter, a programmable start offset parameter, a programmable stop pulse parameter, and a programmable stop offset parameter, each being relative to a programmable master pulse train.

A pulse start operation 504 initiates a slave pulse for a functional circuit and/or one of the functional circuit's modes based on the programmable start pulse parameter and/or a programmable start offset parameter. A pulse stop operation 506 terminates a slave pulse for a functional circuit and/or one of the functional circuit's modes based on the programmable stop pulse parameter and/or a programmable stop offset parameter. In an alternative implementation, a generation operation can replace operations 506 and 508 to generate a slave pulse for one of the functional circuits based on the one or more programmable slave pulse parameters corresponding to the one of the functional circuits, relative to the programmable master pulse train.

The programming operation 502 can occur externally through a programming interface based on external inputs (e.g., a software update released by a software provider for the electronic device). Alternatively, the programming operation 502 can occur internally through a programming interface responsive to detection of a re-configuration event, such as a change in power condition or another reconfiguration event. For example, if the electronic device switches to a low power operation, the electronic device can automatically reconfigure the slave pulse parameters for one or more of the functional circuits of the electronic device to adapt to the low power condition. Alternatively, if the electronic device switches to battery power or an externally-powered mode (e.g., the electronic device is plugged into a power supply, such as a power grid, etc.), the electronic device can automatically reconfigure the slave pulse parameters for one or more of the functional circuits of the electronic device to adapt to the new power condition. In yet another example, the electronic device can automatically reconfigure its slave pulse parameters responsive to reconfiguration events, such as changes in image capture resolution, ambient environment brightness, backlighting, the number of controllers plugged into a gaming console, requirements of an executing game or streaming video, etc. Manual programming is not required, as the electronic device can internally/automatically reconfigure itself responsive to detection of a reconfiguration event.

In one implementation, a first example method is provided including, for operation of one or more of a set of functional circuits, setting, for at least one or more of the set of functional circuits to be operated, a programmable start pulse parameter, a programmable start offset parameter, a programmable stop pulse parameter, and a programmable stop offset parameter, relative to a programmable master pulse train; starting a slave pulse for one of the functional circuits based on the programmable start pulse parameter and the programmable start offset parameter corresponding to the one of the functional circuits, relative to the programmable master pulse train; and stopping the slave pulse for the one of the functional circuits based on the programmable stop pulse parameter and programmable stop offset parameter corresponding to the one of the functional circuits, relative to the programmable master pulse train.

In another implementation, a second example method includes any of the previous example methods wherein at least one of the set of the functional circuits operates in more than one mode and the setting operation includes setting a programmable start pulse parameter, a programmable start offset parameter, a programmable stop pulse parameter, and a programmable stop offset parameter for each mode of the at least one of the set of the functional circuits.

In another implementation, a third example method includes any of the previous example methods wherein the setting operation includes programming the programmable start pulse parameter, the programmable start offset parameter, the programmable stop pulse parameter, and the programmable stop offset parameter, relative to the programmable master pulse train, via a programming interface for the corresponding of the one or more of the set of functional circuits to be operated.

In another implementation, a fourth example method includes any of the previous example methods wherein the programmable start pulse parameter, the programmable start offset parameter, the programmable stop pulse parameter, and the programmable stop offset parameter are independently programmable for each one of the set of functional circuits.

In another implementation, a fifth example method includes any of the previous example methods wherein the programmable start pulse parameter, the programmable start offset parameter, the programmable stop pulse parameter, and the programmable stop offset parameter are independently programmable for each mode of each one of the set of functional circuits.

In another implementation, a sixth example method includes any of the previous example methods wherein the programmable start pulse parameter, the programmable start offset parameter, the programmable stop pulse parameter, and the programmable stop offset parameter are reconfigured automatically responsive to detection of a change in a power condition.

In another implementation, a seventh example method includes any of the previous example methods wherein the programmable start pulse parameter, the programmable start offset parameter, the programmable stop pulse parameter, and the programmable stop offset parameter are reconfigured automatically responsive to detection of a reconfiguration event.

In another implementation, an eighth example method includes any of the previous example methods wherein the programmable master pulse train is configurable via a programming interface.

In another implementation, a ninth example method includes any of the previous example methods wherein the programmable master pulse train is configurable to include multiple groups of master pulses.

In another implementation, a tenth example method includes any of the previous example methods wherein the programmable master pulse train is configurable to include multiple modes of master pulses groups.

In another implementation, an eleventh example method includes, for operation of one or more of a set of functional circuits, setting, for at least the one or more of the set of functional circuit to be operated, one or more programmable slave pulse parameters, relative to a programmable master pulse train; and generating a slave pulse for one of the functional circuits based on the one or more programmable slave pulse parameters corresponding to the one of the functional circuits, relative to the programmable master pulse train.

In another implementation, a twelfth example method includes the eleventh example method wherein at least one of the functional circuits executes in more than one mode and the setting operation includes setting one or more programmable slave pulse parameters for each mode of the functional circuit.

In another implementation, a thirteenth example method includes any of the previous example methods dependent upon the eleventh example method wherein the setting operation includes programming the one or more programmable slave pulse parameters via a programming interface.

In another implementation, a fourteenth example method includes any of the previous example methods dependent upon the eleventh example method wherein the one or more programmable slave pulse parameters are independently programmable for each functional circuit.

In another implementation, a fifteenth example method includes any of the previous example methods dependent upon the eleventh example method wherein the one or more programmable slave pulse parameters are independently programmable for each mode of each functional circuit.

In another implementation, a sixteenth example method includes any of the previous example methods dependent upon the eleventh example method wherein the one or more programmable slave pulse parameters are reconfigured automatically responsive to detection of a change in a power condition.

In another implementation, a seventeenth example method includes any of the previous example methods dependent upon the eleventh example method wherein the one or more programmable slave pulse parameters are reconfigured automatically responsive to detection of a reconfiguration event.

Another example implementation provides a first electronic device including a configurable pulse generator configured to generate a programmable master pulse train; one or more functional circuits including a programming interface to receive one or more a programmable slave pulse parameters for one or more functional circuits, the programmable slave pulse parameters being depending upon the programmable master pulse train; and a slave pulse generator configured to generate a slave pulse for one of the functional circuits based on the one or more programmable slave pulse parameters corresponding to the one of the functional circuits, relative to the programmable master pulse train.

In another implementation, an example provides the first electronic device wherein at least one of the functional circuits executes in more than one mode and the programming interface of the at least one functional circuits setting receives one or more reconfigured programmable slave pulse parameters for each mode of the functional circuit.

In another implementation, an example provides the first electronic device wherein the one or more programmable slave pulse parameters includes one or more of a programmable start pulse parameter, a programmable start offset parameter, a programmable stop pulse parameter, and a programmable stop offset parameter, each parameter being relative to the programmable master pulse train.

In another implementation, an second electronic device is provided including, for operation of one or more of a set of functional circuits, means for setting, for at least the one or more of the set of functional circuits to be operated, a programmable start pulse parameter, a programmable start offset parameter, a programmable stop pulse parameter, and a programmable stop offset parameter, relative to a programmable master pulse train; means for starting a slave pulse for one of the functional circuits based on the programmable start pulse parameter and the programmable start offset parameter corresponding to the one of the functional circuits, relative to the programmable master pulse train; and means for stopping the slave pulse for the one of the functional circuits based on the programmable stop pulse parameter and programmable stop offset parameter corresponding to the one of the functional circuits, relative to the programmable master pulse train.

In another implementation, a third electronic device is providing including, for operation of one or more of a set of functional circuits, means for setting, for at least the one or ore of the set of functional circuits to be operated, one or more a programmable slave pulse parameters, relative to a programmable master pulse train; and means for generating a slave pulse for one of the functional circuits based on the one or more programmable slave pulse parameters corresponding to the one of the functional circuits, relative to the programmable master pulse train.

The implementations of the various embodiments described herein are implemented as logical steps in one or more electronic devices. The logical operations of the presently described technology may be implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed embodiments. Accordingly, the logical operations making up the embodiments described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a description of the structure and use of the disclosed exemplary embodiments. It will be understood that the configurations and/or approaches described herein are exemplary in nature, and that these specific embodiments or examples are not to be considered in a limiting sense, because numerous variations are possible. Since many implementations of the disclosed subject matter can be made without departing from the spirit and scope of the disclosed subject matter, the invention resides in the claims hereinafter appended. Furthermore, structural features of the different embodiments may be combined in yet another implementation without departing from the recited claims.

What is claimed is:

1. A method comprising:
   for operation of one or more of a set of functional circuits, setting, for at least the one or more of the set of functional circuits to be operated, a programmable start pulse parameter, a programmable start offset parameter, a programmable stop pulse parameter, and a programmable stop offset parameter, relative to a programmable master pulse train;
   starting a slave pulse for one of the functional circuits based on the programmable start pulse parameter and the programmable start offset parameter corresponding to the one of the functional circuits, relative to the programmable master pulse train; and
   stopping the slave pulse for the one of the functional circuits based on the programmable stop pulse parameter and programmable stop offset parameter corresponding to the one of the functional circuits, relative to the programmable master pulse train.

2. The method of claim 1 wherein at least one of the set of functional circuits operates in more than one mode and the setting operation includes setting a programmable start pulse parameter, a programmable start offset parameter, a programmable stop pulse parameter, and a programmable stop offset parameter for each mode of the at least one of the set of functional circuits.

3. The method of claim 1 wherein the setting operation comprises:
   programming the programmable start pulse parameter, the programmable start offset parameter, the programmable stop pulse parameter, and the programmable stop offset parameter, relative to the programmable master pulse train, via a programming interface for the corresponding one of the one or more of the set of functional circuits to be operated.

4. The method of claim 1 wherein the programmable start pulse parameter, the programmable start offset parameter, the programmable stop pulse parameter, and the programmable stop offset parameter are independently programmable for each one of the set of functional circuit.

5. The method of claim 1 wherein the programmable start pulse parameter, the programmable start offset parameter, the programmable stop pulse parameter, and the programmable stop offset parameter are independently programmable for each mode of each one of the set of functional circuits.

6. The method of claim 1 wherein the programmable start pulse parameter, the programmable start offset parameter, the programmable stop pulse parameter, and the programmable stop offset parameter are reconfigured automatically responsive to detection of a change in a power condition.

7. The method of claim 1 wherein the programmable start pulse parameter, the programmable start offset parameter, the programmable stop pulse parameter, and the programmable stop offset parameter are reconfigured automatically responsive to detection of a reconfiguration event.

8. The method of claim 1 wherein the programmable master pulse train is configurable via a programming interface.

9. The method of claim 1 wherein the programmable master pulse train is configurable to include multiple groups of master pulses.

10. The method of claim 1 wherein the programmable master pulse train is configurable to include multiple modes of master pulses groups.

11. A method comprising:
    for operation of one or more of a set of functional circuits, setting, for at least the one or more of the set of functional circuits to be operated, one or more programmable slave pulse parameters, relative to a programmable master pulse train; and
    generating a slave pulse for one of the functional circuits based on the one or more programmable slave pulse parameters corresponding to the one of the functional circuits, relative to the programmable master pulse train;
    wherein the one or more programmable slave pulse parameters are independently programmable for each functional circuit.

12. The method of claim 11 wherein at least one of the functional circuits executes in more than one mode and the setting operation includes setting one or more programmable slave pulse parameters for each mode of the functional circuit.

13. The method of claim 11 wherein the setting operation comprises:
    programming the one or more programmable slave pulse parameters via a programming interface.

14. The method of claim 11 wherein the one or more programmable slave pulse parameters are independently programmable for each mode of each functional circuit.

15. The method of claim 11 wherein the one or more programmable slave pulse parameters are reconfigured automatically responsive to detection of a change in a power condition.

16. The method of claim 11 wherein the one or more programmable slave pulse parameters are reconfigured automatically responsive to detection of a reconfiguration event.

17. An electronic device comprising:
    a configurable pulse generator configured to generate a programmable master pulse train;

one or more functional circuits including a programming interface to receive one or more a programmable slave pulse parameters for one or more functional circuits, the programmable slave pulse parameters being depending upon the programmable master pulse train;

a slave pulse generator configured to generate a slave pulse for one of the functional circuits based on the one or more programmable slave pulse parameters corresponding to the one of the functional circuits, relative to the programmable master pulse train;

wherein the one or more programmable slave pulse parameters are independently programmable for each functional circuit.

18. The electronic device of claim 17 wherein at least one of the functional circuits executes in more than one mode and the programming interface of the at least one functional circuits setting receives one or more reconfigured programmable slave pulse parameters for each mode of the functional circuit.

19. The electronic device of claim 17 wherein the one or more programmable slave pulse parameters includes one or more of a programmable start pulse parameter, a programmable start offset parameter, a programmable stop pulse parameter, and a programmable stop offset parameter, each parameter being relative to the programmable master pulse train.

* * * * *